US012560869B2

(12) United States Patent
    Bhardwaj

(10) Patent No.: US 12,560,869 B2
(45) Date of Patent: Feb. 24, 2026

(54) INSPECTION TOOL, METHOD AND LITHOGRAPHIC APPARATUS

(71) Applicant: ASML NETHERLANDS B.V., Veldhoven (NL)

(72) Inventor: Shikhar Bhardwaj, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 30 days.

(21) Appl. No.: 18/571,913

(22) PCT Filed: May 23, 2022

(86) PCT No.: PCT/EP2022/063831
    § 371 (c)(1),
    (2) Date: Dec. 19, 2023

(87) PCT Pub. No.: WO2022/268419
    PCT Pub. Date: Dec. 29, 2022

(65) Prior Publication Data
    US 2024/0192608 A1      Jun. 13, 2024

(30) Foreign Application Priority Data

Jun. 25, 2021    (EP) ..................................... 21181848

(51) Int. Cl.
    *G03F 7/00*              (2006.01)
(52) U.S. Cl.
    CPC ........ *G03F 7/70341* (2013.01); *G03F 7/7085* (2013.01); *G03F 7/70875* (2013.01); *G03F 7/70916* (2013.01)

(58) Field of Classification Search
    CPC ............... G03F 7/70341; G03F 7/7085; G03F 7/70875; G03F 7/70916
    See application file for complete search history.

(56) References Cited

U.S. PATENT DOCUMENTS

| | | | |
|---|---|---|---|
| 6,952,253 B2 | 10/2005 | Lof et al. | |
| 7,119,874 B2 | 10/2006 | Cox et al. | |

(Continued)

FOREIGN PATENT DOCUMENTS

| | | |
|---|---|---|
| EP | 2042930 | 4/2009 |
| WO | 99/49504 | 9/1999 |
| WO | 2020/064265 | 4/2020 |

OTHER PUBLICATIONS

International Search Report dated Sep. 26, 2022, issued in corresponding PCT Patent Application No. PCT/EP2022/063831 (3 pgs.).

(Continued)

*Primary Examiner* — Hung V Nguyen
(74) *Attorney, Agent, or Firm* — Pillsbury Winthrop Shaw Pittman, LLP

(57) ABSTRACT

A tool for assessing a hole property of one or more holes in a component of a lithographic apparatus, the tool including: an assessment substrate; a fluid supply configured to supply a jet of fluid from each of the one or more holes to a first surface of the assessment substrate, wherein the fluid is supplied at a fluid temperature such that the one or more jets of fluid cause local temperature variations in at least part of the assessment substrate; and an infrared sensor configured to sense a temperature distribution of the assessment substrate in dependence on the local temperature variations.

20 Claims, 8 Drawing Sheets

(56) References Cited

U.S. PATENT DOCUMENTS

| | | | | |
|---|---|---|---|---|
| 8,941,808 | B2 * | 1/2015 | Nakano | G03F 7/38 |
| | | | | 355/30 |
| 10,747,127 | B2 * | 8/2020 | Van Der Meulen | |
| | | | | G03F 7/70875 |
| 2006/0047480 | A1 | 3/2006 | Lenz et al. | |
| 2010/0245790 | A1 | 9/2010 | Seltmann et al. | |
| 2012/0113402 | A1 | 5/2012 | Cadee et al. | |
| 2015/0241789 | A1 | 8/2015 | Wu et al. | |
| 2017/0212429 | A1 | 7/2017 | Koevoets et al. | |
| 2019/0294056 | A1 * | 9/2019 | Kunnen | H01L 21/68 |
| 2020/0150545 | A1 | 5/2020 | Gattobigio et al. | |

OTHER PUBLICATIONS

Written Opinion of the International Searching Authority dated Sep. 26, 2022, issued in corresponding PCT Patent Application No. PCT/EP2022/063831 (7 pgs.).
Anonymous, "Thin Film Sensor on a Substrate for Immersion Diagnostics", Research Disclosure, Kenneth Mason Publications, vol. 581, No. 53 (2012) (4 pgs.).

* cited by examiner

Fig. 2d

Fig. 4
200
$Q_{gas}$
$Q_{cond}$
$Q_{rad} + Q_{conv}$
202
Fig. 5
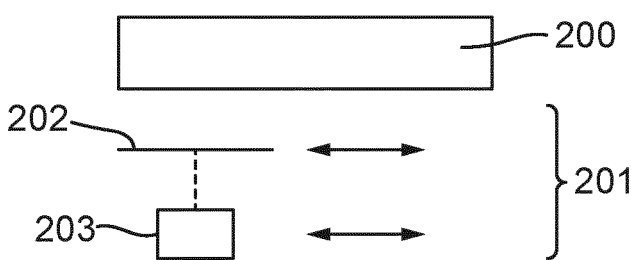
200
202
203
201
Fig. 6
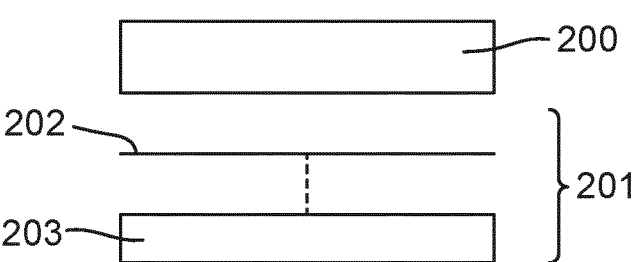
200
202
203
201

INSPECTION TOOL, METHOD AND LITHOGRAPHIC APPARATUS

CROSS-REFERENCE TO RELATED APPLICATIONS

This application is the U.S. national phase entry of PCT Patent Application No. PCT/EP2022/063831 which was filed on May 23, 2022, which claims the benefit of priority of European Patent Application No. 21181848.9 which was filed on Jun. 25, 2021 and which is incorporated herein in its entirety by reference.

FIELD

The present invention relates to an inspection tool and method for a lithographic apparatus. The present invention also relates to the lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer). Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Further improvements in the resolution of smaller features may be achieved by providing an immersion fluid having a relatively high refractive index, such as water, on the substrate during exposure. The effect of the immersion fluid is to enable imaging of smaller features since the exposure radiation will have a shorter wavelength in the fluid than in gas. The effect of the immersion fluid may also be regarded as increasing the effective numerical aperture (NA) of the system and also increasing the depth of focus.

The immersion fluid may be confined to a localized area between the projection system of the lithographic apparatus and the substrate by a fluid handling structure. The flows of the immersion fluid need to be appropriately controlled during operation of the lithographic apparatus.

There is a general need to improve inspection of fluid supply and extraction openings in the fluid handling system. This requires new tools and techniques for appropriately inspecting one or more openings in a surface of the fluid handling system facing the substrate.

SUMMARY

According to a first aspect of the invention, there is provided a tool for assessing a hole property of one or more holes in a component of a lithographic apparatus, the tool comprising: an assessment substrate; a fluid supply configured to supply a jet of fluid from each of the one or more holes to a first surface of the assessment substrate, wherein the fluid is supplied at a fluid temperature such that the one or more jets of fluid cause local temperature variations in at least part of the assessment substrate; and an infrared sensor configured to sense a temperature distribution of the assessment substrate in dependence on the local temperature variations.

According to a second aspect of the invention, there is provided a method of assessing a hole property of one or more holes in a component of a lithographic apparatus, the method comprising: providing an assessment substrate; supplying a jet of fluid from each of the one or more holes to a first surface of the assessment substrate, wherein the fluid is supplied at a fluid temperature such that the one or more jets of fluid cause local temperature variations in at least part of the assessment substrate; sensing, by an infrared sensor, a temperature distribution of the assessment substrate in dependence on the local temperature variations; assessing the hole property in dependence on the sensed temperature distribution.

Further embodiments, features and advantages of the present invention, as well as the structure and operation of the various embodiments, features and advantages of the present invention, are described in detail below with reference to the accompanying drawings.

DESCRIPTION OF THE DRAWINGS

Embodiments of the invention will now be described, by way of example only, with reference to the accompanying schematic drawings, in which corresponding reference symbols indicate corresponding parts, and in which:

FIGS. 2a, 2b, 2c and 2d each depict, in cross section, two different versions of a fluid handling system with different features illustrated on the left hand side and the right hand side of each version, which may extend around the complete circumference;

FIG. 4 depicts a schematic of the different heat transfer mechanisms affecting the temperature distribution of the assessment substrate in an embodiment;

FIG. 5 shows an inspection tool according to an embodiment;

FIG. 6 shows an inspection tool according to an embodiment;

The features shown in the figures are not necessarily to scale, and the size and/or arrangement depicted is not limiting. It will be understood that the figures include optional features which may not be essential to the invention. Furthermore, not all of the features of the apparatus are depicted in each of the figures, and the figures may only show some of the components relevant for describing a particular feature. In the figures, like parts are indicated by like references.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
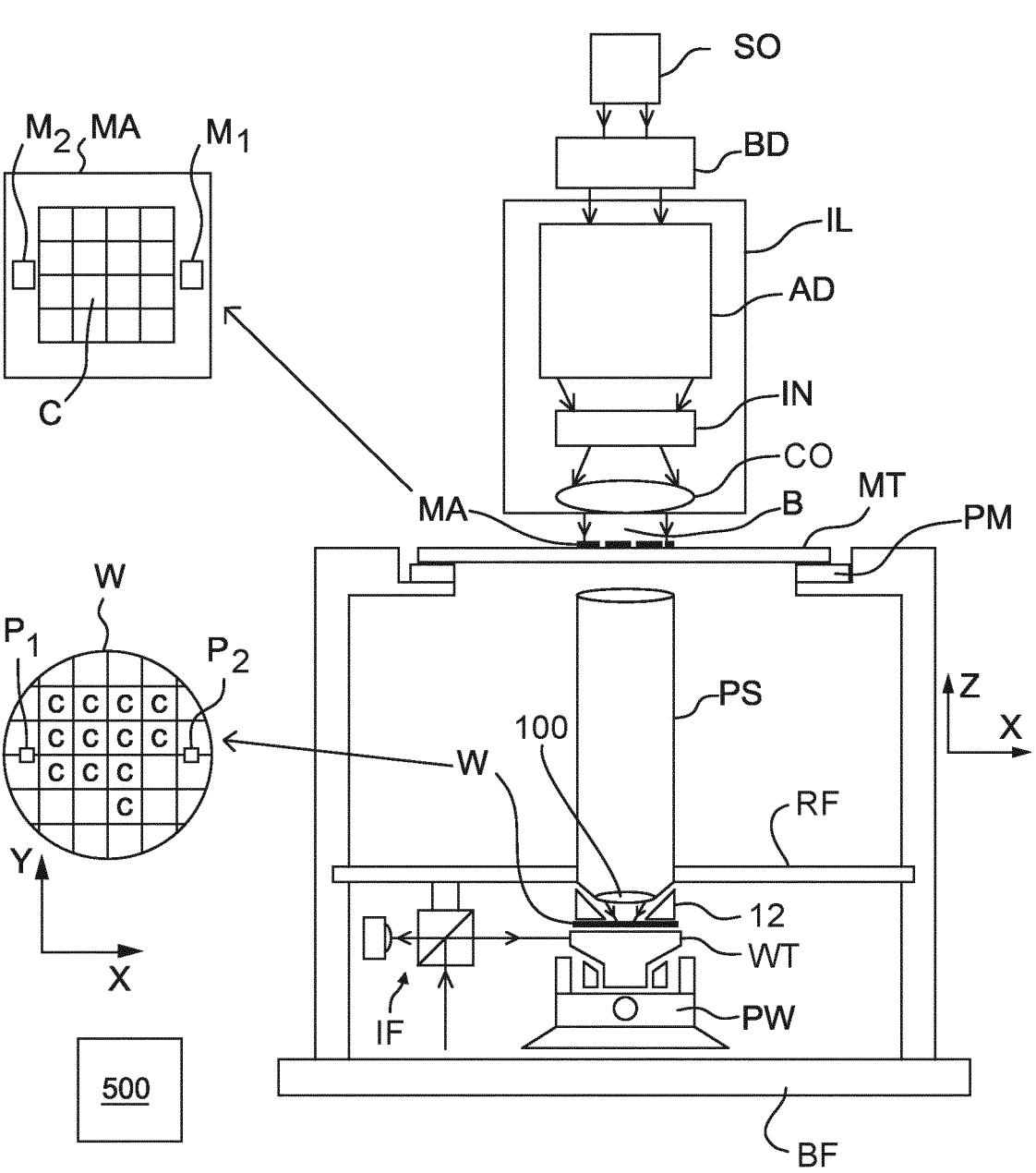
FIG. 1 depicts the schematic overview of the lithographic apparatus.

FIG. 1 schematically depicts a lithographic apparatus. The lithographic apparatus includes an illumination system (also referred to as illuminator) IL configured to condition a radiation beam B (e.g., UV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a substrate table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W. A controller 500 controls the overall operation of the apparatus. Controller 500 may be a centralised control system or a system of multiple separate sub-controllers within various sub-systems of the lithographic apparatus.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus is of a type wherein at least a portion of the substrate W may be covered by an immersion liquid having a relatively high refractive index, e.g., water, so as to fill an immersion space 11 between the projection system PS and the substrate W—which is also referred to as immersion lithography. More information on immersion techniques is given in U.S. Pat. No. 6,952,253, which is incorporated herein by reference.

The lithographic apparatus may be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage (not depicted in figures). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Immersion techniques have been introduced into lithographic systems to enable improved resolution of smaller features. In an immersion lithographic apparatus, a liquid layer of immersion liquid having a relatively high refractive index is interposed in the immersion space 11 between a projection system PS of the apparatus (through which the patterned beam is projected towards the substrate W) and the substrate W. The immersion liquid covers at least the part of the substrate W under a final element of the projection system PS. Thus, at least the portion of the substrate W undergoing exposure is immersed in the immersion liquid.

In commercial immersion lithography, the immersion liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space 11 as immersion liquid. Other liquids with a high refractive index can be used besides water as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the immersion space 11 between the final element 100 and a surface facing the final element 100. The facing surface is a surface of substrate W or a surface of the supporting stage (or substrate support WT) that is co-planar with the surface of the substrate W. (Please note that reference in the following text to surface of the substrate W also refers in addition or in the alternative to the surface of the substrate support WT, unless expressly stated otherwise; and vice versa). A fluid handling structure 12 present between the projection system PS and the substrate support WT is used to confine the immersion liquid to the immersion space 11. The immersion space 11 filled by the immersion liquid is smaller in plan than the top surface of the substrate W and the immersion space 11 remains substantially stationary relative to the projection system PS while the substrate W and substrate support WT move underneath.

Other immersion systems have been envisaged such as an unconfined immersion system (a so-called 'All Wet' immersion system) and a bath immersion system. In an unconfined immersion system, the immersion liquid covers more than the surface under the final element 100. The liquid outside the immersion space 11 is present as a thin liquid film. The liquid may cover the whole surface of the substrate W or even the substrate W and the substrate support WT co-planar with the substrate W. In a bath type system, the substrate W is fully immersed in a bath of immersion liquid.

The fluid handling structure 12 is a structure which supplies the immersion liquid to the immersion space 11, removes the immersion liquid from the immersion space 11 and thereby confines the immersion liquid to the immersion space 11. It includes features which are a part of a fluid supply system. The arrangement disclosed in PCT patent application publication no. WO 99/49504 is an early fluid handling structure comprising pipes which either supply or recover the immersion liquid from the immersion space 11 and which operate depending on the relative motion of the stage beneath the projection system PS. In more recent designs, the fluid handling structure extends along at least a part of a boundary of the immersion space 11 between the final element 100 of the projection system PS and the substrate support WT or substrate W, so as to in part define the immersion space 11.

The fluid handing structure 12 may have a selection of different functions. Each function may be derived from a corresponding feature that enables the fluid handling structure 12 to achieve that function. The fluid handling structure 12 may be referred to by a number of different terms, each referring to a function, such as barrier member, seal member, fluid supply system, fluid removal system, liquid confinement structure, etc.

As a barrier member, the fluid handling structure 12 is a barrier to the flow of the immersion liquid from the immersion space 11. As a liquid confinement structure, the structure confines the immersion liquid to the immersion space 11. As a seal member, sealing features of the fluid handling structure 12 form a seal to confine the immersion liquid to the immersion space 11. The sealing features may include an additional gas flow from an opening in the surface of the seal member, such as a gas knife.

In an embodiment the fluid handling structure 12 may supply immersion fluid and therefore be a fluid supply system.

In an embodiment the fluid handling structure 12 may at least partly confine immersion fluid and thereby be a fluid confinement system.

In an embodiment the fluid handling structure 12 may provide a barrier to immersion fluid and thereby be a barrier member, such as a fluid confinement structure.

In an embodiment the fluid handling structure 12 may create or use a flow of gas, for example to help in controlling the flow and/or the position of the immersion fluid.

The flow of gas may form a seal to confine the immersion fluid so the fluid handling structure 12 may be referred to as a seal member; such a seal member may be a fluid confinement structure.

In an embodiment, immersion liquid is used as the immersion fluid. In that case the fluid handling structure 12 may be a liquid handling system. In reference to the aforementioned description, reference in this paragraph to a feature defined with respect to fluid may be understood to include a feature defined with respect to liquid.

A lithographic apparatus has a projection system PS. During exposure of a substrate W, the projection system PS projects a beam of patterned radiation onto the substrate W. To reach the substrate W, the path of the radiation beam B passes from the projection system PS through the immersion liquid confined by the fluid handling structure 12 between the projection system PS and the substrate W. The projection system PS has a lens element, the last in the path of the beam, which is in contact with the immersion liquid. This lens element which is in contact with the immersion liquid may be referred to as 'the last lens element' or "the final element". The final element 100 is at least partly surrounded by the fluid handling structure 12. The fluid handling structure 12 may confine the immersion liquid under the final element 100 and above the facing surface.

FIGS. 2a, 2b, 2c and 2d show different features which may be present in variations of a fluid handling system. The designs may share some of the same features as FIGS. 2a, 2b, 2c and 2d unless described differently. The features described herein may be selected individually or in combination as shown or as required. The figures depict different versions of a fluid handling system with different features illustrated on the left hand side and the right hand side, which may extend around the complete circumference. Thus, for example, the fluid handling system may have the same features extending around the complete circumference. For example, the fluid handling system may have only the features of the left hand side of FIG. 2*a*, or the right hand side of FIG. 2*a*, or the left hand side of FIG. 2*b*, or the right hand side of FIG. 2*b*, or the left hand side of 2*c*, or the right hand side of 2*c*, or the left hand side of 2*d*, or the right hand side of 2*d*. Alternatively, the fluid handling system may be provided with any combination of features from these figures at different locations around the circumference. The fluid handling system may comprise the fluid handling structure 12 as described in the variations below.

Figure 2A:
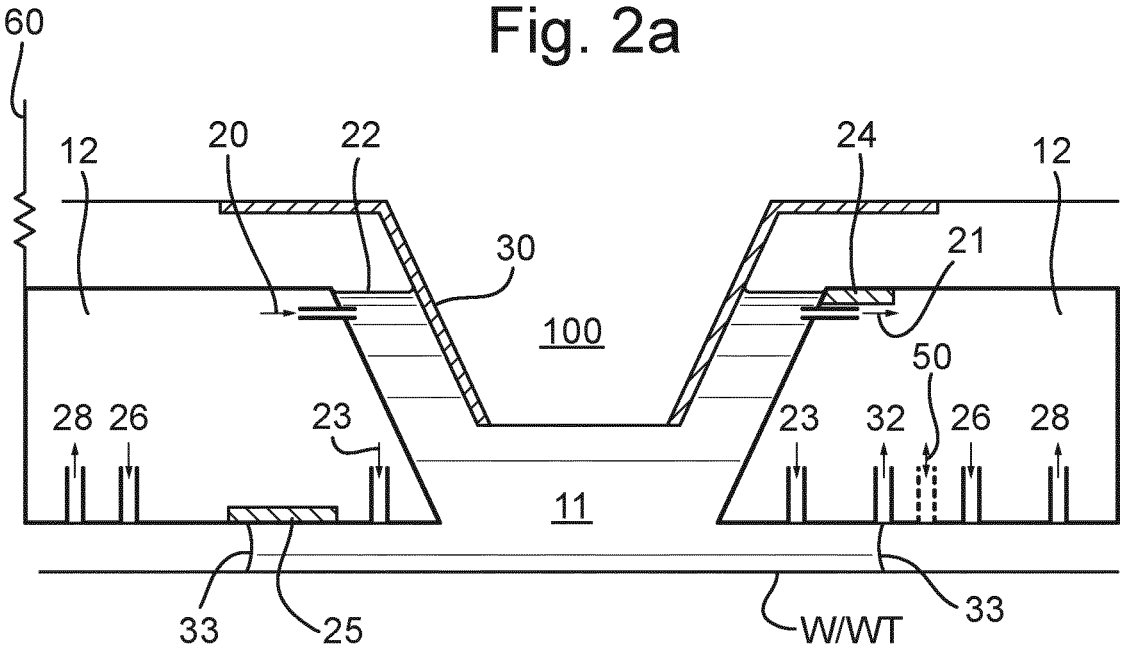

FIG. 2*a* shows a fluid handling structure 12 around the bottom surface of the final element 100. The final element 100 has an inverted frusto-conical shape. The frusto-conical shape having a planar bottom surface and a conical surface. The frusto-conical shape protrudes from a planar surface and having a bottom planar surface. The bottom planar surface is the optically active portion of the bottom surface of the final element 100, through which the radiation beam B may pass. The final element 100 may have a coating 30. The fluid handling structure 12 surrounds at least part of the frusto-conical shape. The fluid handling structure 12 has an inner-surface which faces towards the conical surface of the frusto-conical shape. The inner-surface and the conical surface may have complementary shapes. A top surface of the fluid handling structure 12 may be substantially planar. The fluid handling structure 12 may fit around the frusto-conical shape of the final element 100. A bottom surface of the fluid handling structure 12 may be substantially planar and in use the bottom surface may be parallel with the facing surface of the substrate support WT and/or substrate W. Thus, the bottom surface of the fluid handling structure 12 may be referred to as a surface facing the surface of the substrate W. The distance between the bottom surface and the facing surface may be in the range of 30 to 500 micrometers, desirably in the range of 80 to 200 micrometers.

The fluid handling structure 12 extends closer to the facing surface of the substrate W and substrate support WT than the final element 100. The immersion space 11 is therefore defined between the inner surface of the fluid handling structure 12, the planar surface of the frusto-conical portion and the facing surface. During use, the immersion space 11 is filled with immersion liquid. The immersion liquid fills at least part of a buffer space between the complementary surfaces between the final element 100 and the fluid handling structure 12, in an embodiment at least part of the space between the complementary inner-surface and the conical surface.

The immersion liquid is supplied to the immersion space 11 through an opening formed in a surface of the fluid handling structure 12. The immersion liquid may be supplied through a supply opening 20 in the inner-surface of the fluid handling structure 12. Alternatively or additionally, the immersion liquid is supplied from an under supply opening 23 formed in the bottom surface of the fluid handling structure 12. The under supply opening 23 may surround the path of the radiation beam B and it may be formed of a series of openings in an array or a single slit. The immersion liquid is supplied to fill the immersion space 11 so that flow through the immersion space 11 under the projection system PS is laminar or at least well defined. The supply of the immersion liquid from the under supply opening 23 additionally prevents the ingress of bubbles into the immersion space 11. This supply of the immersion liquid may function as a liquid seal.

The immersion liquid may be recovered from a recovery opening 21 formed in the inner-surface. The recovery of the immersion liquid through the recovery opening 21 may be by application of an underpressure; the recovery through the recovery opening 21 as a consequence of the velocity of the immersion liquid flow through the immersion space 11; or the recovery may be as a consequence of both. The recovery opening 21 may be located on the opposite side of the supply opening 20, when viewed in plan. Additionally or alternatively, the immersion liquid may be recovered through an overflow recovery 24 located on the top surface of the fluid handling structure 12. The supply opening 20 and recovery opening 21 can have their function swapped (i.e. the flow direction of liquid is reversed). This allows the direction of flow to be changed depending upon the relative motion of the fluid handling structure 12 and substrate W.

Additionally or alternatively, immersion liquid may be recovered from under the fluid handling structure 12 through a recovery opening 25 formed in its bottom surface. The recovery opening 25 may serve to hold a meniscus 33 of the immersion liquid to the fluid handling structure 12. The meniscus 33 forms between the fluid handling structure 12 and the facing surface and it serves as border between the liquid space and the gaseous external environment. The recovery opening 25 may be a porous plate which may recover the immersion liquid in a single phase flow. The recovery opening in the bottom surface may be a series of pinning openings 32 through which the immersion liquid is recovered. The pinning openings 32 may recover the immersion liquid in a two phase flow.

Optionally radially outward, with respect to the inner-surface of the fluid handling structure 12, is a gas knife opening 26. Gas may be supplied through the gas knife opening 26 at elevated speed to assist liquid confinement of the immersion liquid in the immersion space 11. The supplied gas may be humidified and it may contain substantially carbon dioxide. Radially outward of the gas knife opening 26 is a gas recovery opening 28 for recovering the gas supplied through the gas knife opening 26.

Further openings, for example open to atmosphere or to a gas source or to a vacuum, may be present in the bottom surface of the fluid handling structure 12, i.e. in the surface of the fluid handling structure 12 facing the substrate W. An example of such an optional further opening 50 is shown in dashed lines on the right hand side of FIG. 2*a*. As shown, the further opening 50 may be a supply or extraction member, which is indicated by the double-headed arrow. For example, if configured as a supply, the further opening 50 may be connected to a liquid supply or a gas supply as with any of the supply members. Alternatively, if configured as an extraction, the further opening 50 may be used to extract fluid, and may for example, be connected to atmosphere or to a gas source or to a vacuum. For example, the at least one further opening 50 may be present between gas knife opening 26 and gas recovery opening 28, and/or between pinning openings 32 and gas knife opening 26. In an alternative arrangement, the fluid handling structure 12 may contain the pinning opening 32, gas knife opening 26 and optionally the under supply opening 23. The supply opening 20 or recovery opening 21 may be formed in the inner surface of the fluid handling structure 12.

The two different versions of the fluid handling structure 12 of the left and right sides of FIG. 2*a* pin the meniscus 33. The version of the fluid handling structure 12 on the right hand side of FIG. 2*a* may pin the meniscus 33 at a position that is substantially fixed with respect to the final element 100, due to the fixed position of the pinning opening 32. The version of the fluid handling structure 12 on the left hand side of FIG. 2a may pin the meniscus 33 below the recovery opening 25, and thus the meniscus 33 may move along the length and/or width of the recovery opening 25. For the radiation beam B to be directed to a full side of the substrate W under exposure, the substrate support WT supporting the substrate W is moved relative to the projection system PS. To maximize the output of substrates W exposed by the lithographic apparatus, the substrate support WT (and so substrate W) is moved as fast as possible. However, there is a critical relative speed (often referred to as a critical scan speed) above which the meniscus 33 between the fluid handling structure 12 and the substrate W becomes unstable. An unstable meniscus 33 has a greater risk of losing immersion liquid, for example in the form of one or more droplets. Furthermore, an unstable meniscus 33 has a greater risk of resulting in the inclusion of gas bubbles in the immersion liquid, especially when the confined immersion liquid crosses the edge of the substrate W.

A droplet present on the surface of the substrate W may apply a thermal load and may be a source of defectivity. The droplet may evaporate leaving a drying stain, it may move transporting contamination such as a particle, it may collide with a larger body of immersion liquid introducing a bubble of gas into the larger body and it may evaporate, applying the thermal heat load to the surface on which it is located. Such a thermal load could be a cause of distortion and/or a source of a positioning error if the surface is associated with positioning of components of the lithographic apparatus relative to the substrate W being imaged. A formation of a droplet on a surface is therefore is undesirable. To avoid formation of such a droplet, the speed of the substrate support WT is thus limited to the critical scan speed at which the meniscus 33 remains stable. This limits the throughput of the lithographic apparatus.

The left hand side of the fluid handling system in FIG. 2a may comprise a spring 60. The spring 60 may be an adjustable passive spring configured to apply a biasing force to the fluid handling structure 12 in the direction of the substrate W. Thus, the spring 60 can be used to control the height of the fluid handling structure 12 above the substrate W. Such adjustable passive springs are described in U.S. Pat. No. 7,199,874 which is herein incorporated by reference in its entirety. Other bias devices may also be appropriate, for example, using an electromagnetic force. Although the spring 60 is shown with the left hand side of FIG. 2a, it is optional and does not need to be included with the other features of the left hand side of FIG. 2a. The spring 60 is not shown on any of the other figures, but could also be included with the other variations of the fluid handling system described in relation to FIG. 2a, 2b, 2c, or 2d.

Figure 2B:
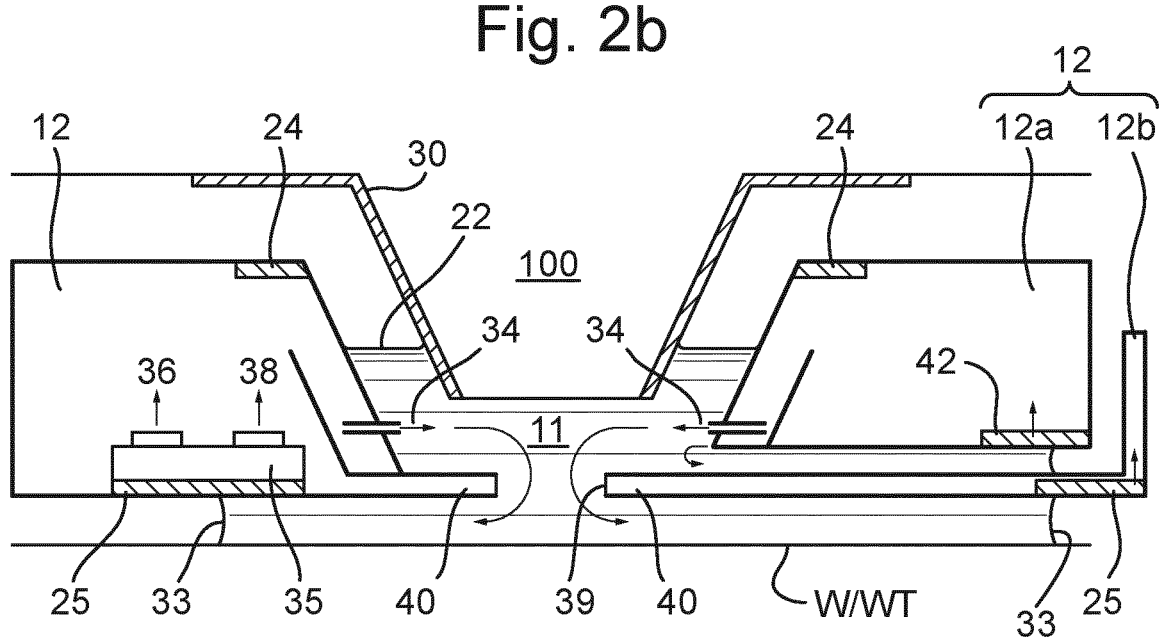

FIG. 2b shows two different versions of the fluid handling structure 12 on its left side and on its right side, which allow movement of the meniscus 33 with respect to the final element 100. The meniscus 33 may move in the direction of the moving substrate W. This decreases the relative speed between the meniscus 33 and the moving substrate W, which may result in improved stability and a reduced risk of breakdown of the meniscus 33. The speed of the substrate W at which the meniscus 33 breaks down is increased so as to allow faster movement of the substrate W under the projection system PS. Throughput is thus increased.

Features shown in FIG. 2b which are common to FIG. 2a share the same reference numbers. The fluid handling structure 12 has an inner surface which complements the conical surface of the frusto-conical shape. The bottom surface of the fluid handling structure 12 is closer to the facing surface than the bottom planar surface of the frusto-conical shape.

Immersion liquid is supplied to the immersion space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B.

Immersion liquid is recovered from the immersion space 11 through recovery openings 25, in the bottom surface of the fluid handling structure 12. As the facing surface moves under the fluid handling structure 12, the meniscus 33 may migrate over the surface of the recovery opening 25 in the same direction as the movement of the facing surface. The recovery openings 25 may be formed of a porous member. The immersion liquid may be recovered in single phase. The immersion liquid may be recovered in a two phase flow. The two phase flow is received in a chamber 35 within the fluid handling structure 12 where it is separated into liquid and gas. The liquid and gas are recovered through separate channels 36, 38 from the chamber 35.

An inner periphery 39 of the bottom surface of fluid handling structure 12 extends into the immersion space 11 away from the inner surface to form a plate 40. The inner periphery 39 forms a small aperture which may be sized to match the shape and size of the radiation beam B. The plate 40 may serve to isolate the immersion liquid at either side of it. The supplied immersion liquid flows inwards towards the aperture, through the inner aperture and then under the plate 40 radially outwardly towards the surrounding the recovery openings 25.

The fluid handling structure 12 may be in two parts as shown on the right hand side of FIG. 2b: an inner part 12a and an outer part 12b. The inner part 12a and the outer part 12b may move relatively to each other, mainly in a plane parallel to facing surface. The inner part 12a may have the supply openings 34 and it may have the overflow recovery 24. The outer part 12b may have the plate 40 and the recovery opening 25. The inner part 12a may have an intermediate recovery 42 for recovering the immersion liquid which flows between the inner part 12a and the outer part 12b.

The two different versions of the fluid handling structure of FIG. 2b thus allow for movement of the meniscus 33 in the same direction as the substrate W, enabling faster scan speeds and increased throughput of the lithographic apparatus. However, the migration speed of meniscus 33 over the surface of the recovery opening 25 in the fluid handling structure 12 of the left side of FIG. 2b may be slow. The fluid handling structure 12 of the right side of FIG. 2b allows for quicker movement of the meniscus 33, by moving the outer part 12b with respect to the inner part 12a and the final element 100. However, it may be difficult to control the intermediate recovery 42 so as to ensure that enough immersion liquid is provided between the inner part 12a and the outer part 12b to prevent contact therebetween. Implementations may also include a liquid supply being provided in the moving outer part 12b.

Figure 2C:
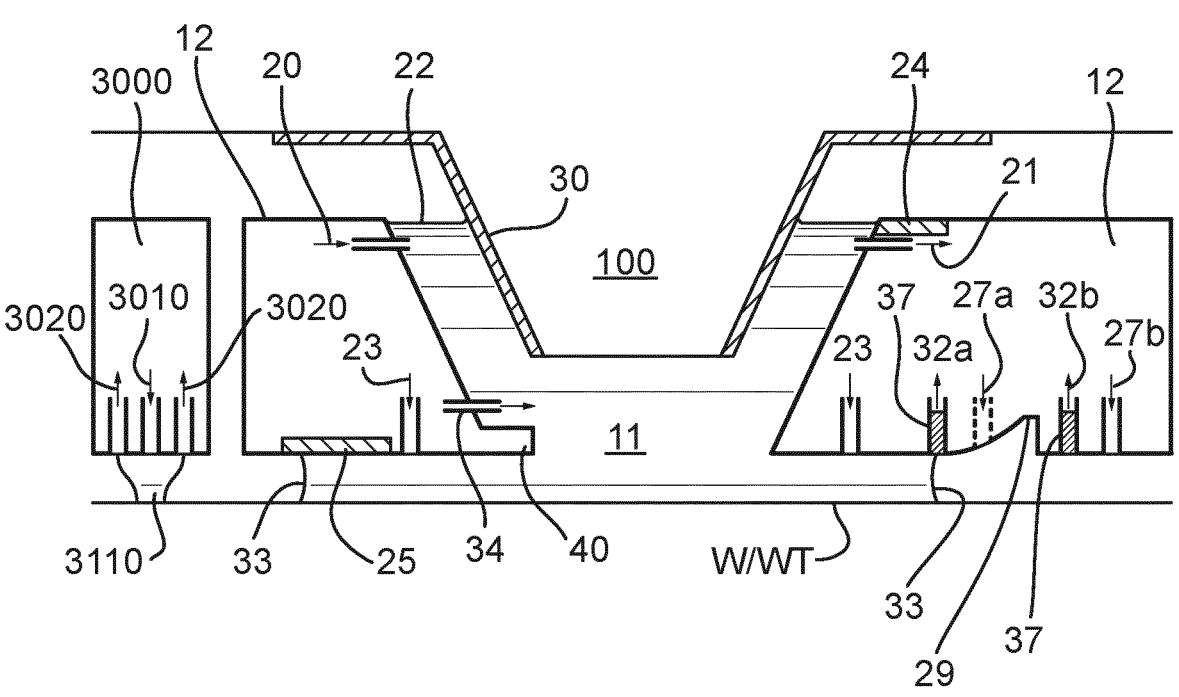

FIG. 2c shows two different versions of the fluid handling structure 12 on its left side and on its right side, which may be used to pin the meniscus 33 of the immersion liquid to the fluid handling structure 12 as described above in relation to FIGS. 2a and/or 2b. Features shown in FIG. 2c which are common to FIGS. 2a and/or 2b share the same reference numbers.

The fluid handling structure 12 has an inner surface which compliments the conical surface of the frusto-chronical shape. The bottom surface of the fluid handling structure 12 is closer to the facing surface than the bottom planar surface of the frusto-chronical shape. Immersion liquid is supplied to the immersion space 11 delivered through an opening formed in a surface of the fluid handling structure 12. The immersion liquid may be supplied through a supply opening 34 in the inner surface of the fluid structure 12. Alternatively or additionally, the immersion liquid may be supplied through a supply opening 20 in the inner surface of the fluid structure 12. Alternatively or additionally, the immersion liquid is supplied through the under supply opening 23. The immersion liquid may be recovered via an extraction member, for example, via recovery opening 21 formed in the inner-surface and/or overflow recovery 24 and/or one or more openings in a surface of the fluid handling structure 12 as described below.

The two different versions of the fluid handling structure 12 of the left and right sides of FIG. 2c pin the meniscus 33. The version of the fluid handling structure 12 on the right hand side of FIG. 2c may pin the meniscus 33 at a position that is substantially fixed with respect to the final element 100, due to the fixed position of the recovery opening 32a. The version of the fluid handling structure 12 on the left hand side of FIG. 2c may pin the meniscus 33 below the recovery opening 25, and thus the meniscus 33 may move along the length and/or width of the recovery opening 25.

As described above in relation to FIG. 2b, an inner periphery of the bottom surface of fluid handling structure 12 may extends into the immersion space 11 away from the inner surface to form a plate 40 as shown on the left hand side. As described above, this may form a small aperture, and may isolate the immersion liquid at either side and/or cause immersion liquid to flow inwards towards the aperture, through the inner aperture and then under the plate 40 radially outwardly towards the surrounding the recovery openings 25. Although this features is shown on the left hand side in FIG. 2c, it is optional in combination with the other features shown. Preferably, as shown on the left hand side, immersion liquid is supplied to the immersion space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B. Alternatively or additionally, the immersion liquid may be supplied through a supply opening 20 in the inner surface of the fluid structure 12. Alternatively or additionally, the immersion liquid is supplied through the under supply opening 23. Although the supply openings 34 are the preferred liquid supply, any combination of supply openings 34, supply openings 20 and/or under supply openings 23 may be provided.

As shown on the left hand side of FIG. 2c, a fluid handling system may comprise the fluid handling structure 12 as described above and a further device 3000. The fluid handling structure 12 may have an extraction member, such as recovery opening 25, and a liquid supply opening, such as the under supply opening 23. It will be understood that the fluid handling structure 12 may comprise any configuration as disclosed in relation to the left hand of FIG. 2a, the right hand side of FIG. 2a, the left hand side of FIG. 2b, the right hand side of FIG. 2b or (as described below) the right hand side of FIG. 2c, in combination with the further device 3000.

The further device 3000 may otherwise be referred to as a droplet catcher. The further device 3000 is provided to reduce occurrence of liquid on the surface of the substrate W after the fluid handling structure 12 has moved over the surface. The further device 3000 may comprise a liquid supply member 3010 and at least one extraction member 3020. The at least one extraction member 3020 may be formed in a shape surrounding the at least one supply member 3010 in plan. The at least one liquid supply member 3010 may be configured to provide a further liquid to a space 3110 between at least a part of the further device 3000 and the surface of the substrate W. The further device 3000 may be configured to recover at least some of the liquid via the at least one extraction member 3020. The further device 3000 may be used to incorporate any liquid left on the surface of the substrate W with the liquid in the space 3110 and then use the further device 3000 to extract the liquid such that the amount of liquid remaining on the surface of the substrate W is reduced.

The further device 3000 is shown as a separate device from the fluid handling structure 12 in FIG. 2c. The further device 3000 may be positioned adjacent to the fluid handling structure 12. Alternatively, the further device 3000 may be part of, i.e. integral to, the fluid handling structure 12 (as in FIG. 2d, however, either arrangement can be selected).

The further device 3000 may be configured to provide a liquid to the space 3110 which is separate from the liquid provided by the fluid handling structure 12.

Additionally or alternatively, the fluid handling structure 12 may have the components as shown on the right hand side of FIG. 2c. More specifically, the fluid handling structure 12 may comprise the at least one liquid supply member, two extraction members (e.g., recovery openings 32a and 32b) and two gas supply members (e.g., gas supply openings 27a and 27b) formed on the surface of the fluid handling structure 12. Gas supply opening 27a can be omitted, i.e. is optional. The at least one liquid supply member may be the same as the under supply opening 23 in the bottom surface of the fluid handling structure 12 described above or the supply opening 20 or liquid supply openings 34 formed on the inner surface of the fluid handling structure 12 described in relation to left hand side of FIG. 2b. The liquid supply member, the extraction members and the gas supply members may be formed on the surface of the fluid handling structure 12. Specifically, these components may be formed on a surface of the fluid handling structure 12 facing the substrate W, i.e. the bottom surface of the fluid handling structure 12.

At least one of the two extraction members may comprise a porous material 37 therein. The porous material 37 may be provided within an opening, e.g., recovery opening 32a through which fluid handling structure 12 extracts fluid from below the fluid handling structure 12 and may recover the immersion liquid in a single phase flow. The other of the two extraction members, e.g., recovery opening 32b may recover the immersion fluid as a dual phase extractor. The porous material 37 does not need to be flush with the bottom surface of the fluid handling structure 12.

Specifically, the fluid handling structure 12 may comprise the liquid supply member (e.g., under supply opening 23), with a first extraction member (e.g., recovery opening 32a) radially outwards of the liquid supply member, and a first gas supply member (e.g., gas supply opening 27a) radially outwards of the first extraction member, and the second extraction member (e.g., recovery opening 32b) radially outwards of the first gas supply member, and a second gas supply member (e.g., gas supply opening 27b) radially outwards of the second extraction member. Similar to FIG. 2*a*, further openings, for example open to atmosphere or to a gas source or to a vacuum, may be present in the bottom surface of the fluid handling structure 12 as described previously (in relation to the fluid handling structure 12).

For example, at least one further opening (not shown) may be provided in the bottom surface of the fluid handling structure 12. The further opening is optional. The further opening may be arranged between the first extraction member (e.g., recovery opening 32*a*) and the first gas supply member (e.g., gas supply opening 27*a*) as described in the arrangement above. Alternatively or additionally, the further opening may be arranged between the second extraction member (e.g., recovery opening 32*b*) and the second gas supply member (e.g., gas supply opening 27*b*) as described in the arrangement above. The further opening may be the same as further opening 50 described above.

Optionally, the fluid handling structure 12 comprises a recess 29. The recess 29 may be provided between the recovery opening 32*a* and recovery opening 32*b* or gas supply opening 27*a* and recovery opening 32*b*. The shape of the recess 29 may be uniform around the fluid handling structure 12 and may optionally contain an inclined surface. In the case of the recess 29 provided between the recovery opening 32*a* and recovery opening 32*b*, the gas supply opening 27*b* may be provided on the inclined surface as shown in FIG. 2*c*. In the case of the recess 29 provided between the supply opening 27*a* and recovery opening 32*b*, the gas supply opening 27*b* may be provided on the inclined surface or a part of the bottom surface of the fluid handling structure 12 which is parallel to the surface of the substrate W. Alternatively, the shape of the recess 29 may vary around the circumference of the fluid handling structure 12. The shape of the recess 29 may be varied to alter the impact of gas supplied from the gas supply members on the fluid below the fluid handling structure 12. The recess 29 may alternatively be a negative recess, i.e. a protruding structure, that narrows the separation between the fluid handling structure 12 and the substrate W.

Figure 2D:
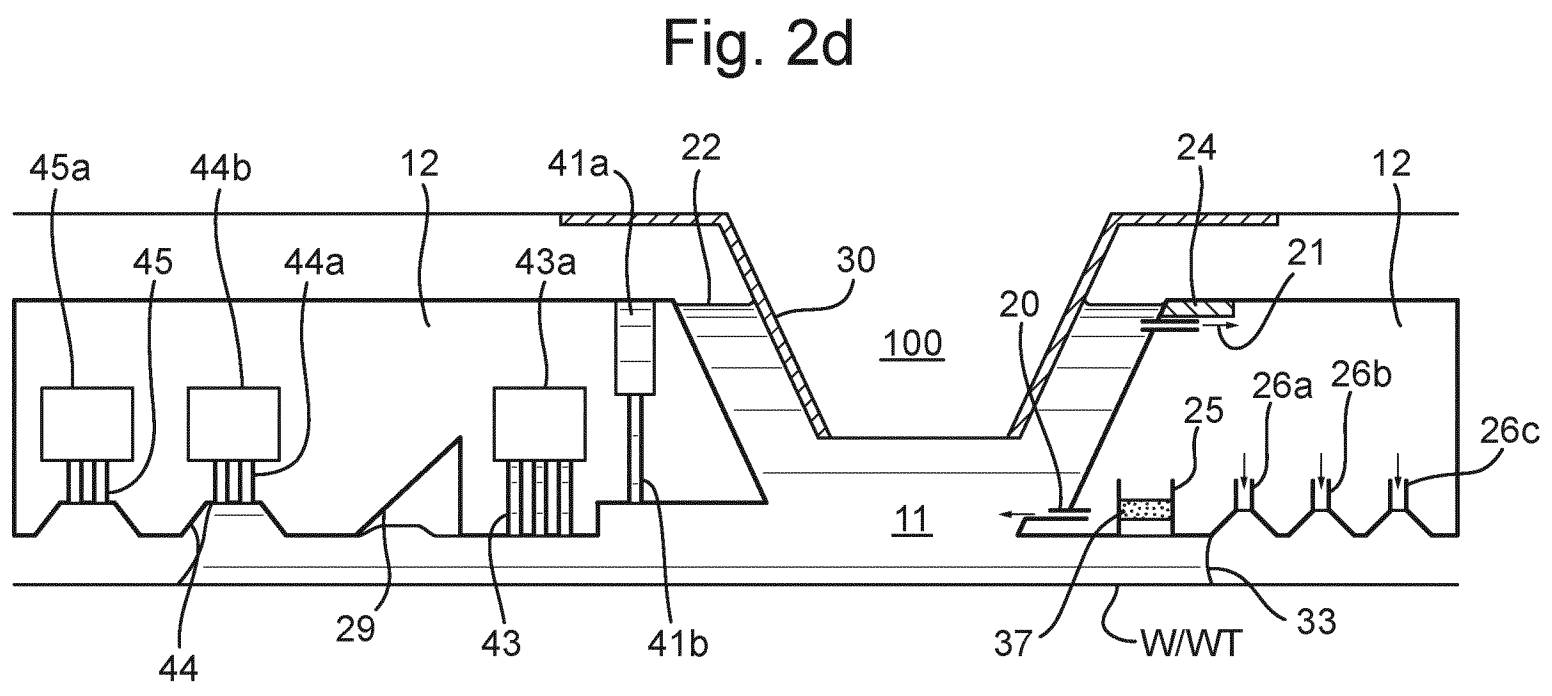

FIG. 2*d* shows, in its left and right halves, two different versions of the fluid handling structure 12. The fluid handling structure 12 of the left half of FIG. 2*d* has a liquid injection buffer 41*a*, which holds a buffer amount of immersion liquid, and liquid injection holes 41 which supply immersion liquid from the liquid injection buffer to the space 11. Outwardly of the liquid injection holes 41 are inner liquid recovery apertures 43 for conducting liquid to an inner recovery buffer 43*a* which is provided with a porous member. A recess 29 similar to that described relating to FIG. 2*c* is provided outward of the inner liquid recovery apertures 43. Outward of the recess 29, in the lower face of the fluid handling structure 12 is a gas guiding groove 44 into which open outer recovery holes 44*a*. The outer recovery holes 44*a* lead a two-phase recovery flow to outer recovery buffer 44*b* which is also provided with a porous member. Outermost are gas sealing holes 45 which communicate between a gas sealing buffer volume 45*a* and the space underneath the fluid handling structure 12 to provide a gas flow to contain the immersion liquid. In the above-described implementations, the meniscus 33 may to pinned to the recovery opening 32*a* or it may be moveable.

The fluid handling structure 12 of the right half of FIG. 2*d* has a liquid supply opening 20 in the inner inclined face thereof. In the underside of the fluid handling structure 12 there are (from inner side to outer side) an extraction opening 25 provided with a porous member 37; a first gas knife opening 26*a*, a second gas knife opening 26*b* and a third gas knife opening 26*c*. Each of these openings opens into a groove in the underside of the fluid handling structure 12 that provides a buffer volume. The outermost part of the fluid handling structure 12 is stepped so as to provide a greater separation between the fluid handling structure 12 and the substrate W.

FIGS. 2*a* to 2*d* show examples of different configurations which can be used as part of a fluid handling system. It will be understood that the examples provided above refer to specific extraction members and recovery members, but it is not necessary to use the exact type of extraction member and/or recovery member. In some cases different terminology is used to indicate the position of the member, but the same functional features may be provided. Examples of the extraction member referred to above include recovery opening 21, overflow recover 24, recovery opening 25 (possibly comprising a porous plate and/or the chamber 35), gas recovery opening 28, pinning opening 32, recovery opening 32*a*, recovery opening 32*b* and/or the intermediate recovery 42. Examples of the supply member referred to above include supply opening 20, under supply opening 23, gas knife opening 26, gas supply opening 27*a*, gas supply opening 27*b*, and/or supply openings 34. In general, an extraction member used to extract/recover fluid, liquid or gas is interchangeable with at least any of the other examples used which extract/recover fluid, liquid or gas respectively. Similarly, a supply member used to supply fluid, liquid or gas is interchangeable with at least any of the other examples used which supply fluid, liquid or gas respectively. The extraction member may extract/recover fluid, liquid or gas from a space by being connected to an underpressure which draws the fluid, liquid or gas into the extraction member. The supply member may supply fluid, liquid or gas to the space by being connected to a relevant supply.

As described earlier, the immersion liquid may be extracted from the immersion space 11, which is also referred to herein as a liquid confinement space 11, by an extraction member. As shown in FIGS. 2*a*, 2*c* and 2*d*, the extraction member may be a recovery opening 21. The extraction member may be located on the opposite side of the supply opening 20, when viewed in plan. The extraction member may extract both liquid and gas. The supply opening 20 may supply liquid. Both the extraction member and the supply opening 20 may be provided in an inner-surface, that is a wall, that faces towards the conical surface of the frusto-conical shape of the final element 100. There may therefore be a continuous flow of water through the liquid confinement space 11 around the final element 100.

As described earlier, the fluid handling system may comprise the fluid handling structure 12 and/or the further device 3000. The fluid handling system generally comprises at least one bottom surface that is substantially planar and in use the at least one bottom surface may be parallel with the facing surface of the substrate support WT and/or substrate W. Thus, the at least one bottom surface of the fluid handling system may be referred to as a substrate facing surface 200 of the fluid handling system. The substrate facing substrate 200 may be a surface of the fluid handling structure 12. The substrate facing substrate 200 may be a surface of the further device 3000. The substrate facing substrate 200 may be any other surface of the fluid handling system facing the substrate W. Furthermore, the substrate facing surface 200 may be a combination of surfaces of the fluid handling system facing the substrate". For example, the substrate facing surface 200 may comprise one or more surfaces of the fluid handling structure 12 and one or more surfaces of the further device 3000.

As illustrated in the configurations of FIGS. 2a to 2d, the substrate facing surface 200 may be provided with one or more openings. The one or more openings may include, but are not limited to, a fluid supply member and/or a fluid extraction member. Examples of the fluid extraction member include, but are not limited to, recovery opening 25, gas recovery opening 28, pinning opening 32, recovery opening 32a, recovery opening 32b, extraction member 3020, liquid recovery aperture 43 and/or outer recovery hole 44a. The fluid extraction member may further be any other opening that is used to extract/recover fluid, liquid, and/or gas. Examples of the fluid supply member include under supply opening 23, gas knife opening 26, gas supply opening 27a, gas supply opening 27b, liquid supply member 3010 and/or liquid injection hole 41b. The fluid supply member may further be any other opening that is used to supply fluid, liquid, and/or gas. The one or more openings in the substrate facing surface 200 may alternatively or additionally include other openings, such as further opening 50 and/or gas sealing hole 45. The one or more openings in the substrate facing surface 200 may include openings for single-phase or two-phase flow of fluid.

The one or more openings in the substrate facing surface 200 may serve to provide immersion fluid to the immersion space 11, remove immersion fluid from the immersion space 11, and/or maintain the immersion fluid in the immersion space 11. The ability of the one or more openings to fulfil or achieve one or more of these purposes may be adversely affected by manufacturing defects, blockages, contamination and/or any other defects of the opening. For example, a blockage of an immersion fluid supply member may reduce the incoming flow rate of immersion liquid to the immersion space 11, which may lead to a lack of immersion fluid in the immersion space 11. As another example, a blockage of an immersion fluid extraction member may reduce the extraction capabilities of the immersion fluid extraction member, which may lead to an overflow of immersion fluid in the immersion space 11. As yet another example, a blockage of a gas knife opening 26 may reduce pressure in the gas seal used to retain the immersion fluid in the immersion space 11, which may lead to immersion fluid escaping from the immersion space 11.

Any defect of the one or more openings in the substrate facing surface 200 may thus adversely affect the performance of the fluid handling system, and in turn may adversely affect the performance of the lithographic apparatus.

A fluid handling system with one or more openings in the substrate facing surface 200 that are subject to manufacturing defects may have to be discarded due to the reduced performance capabilities thereof. This may lead to an increased cost and/or an increased waste. A fluid handling system, that during use, becomes subject to a blockage or other defect of one or more openings in the substrate facing surface 200 may have to be taken out of operation. The one or more openings may then undergo a cleaning or correction procedure, and before being re-installed in the lithographic apparatus. This may lead to an increased down-time of the lithographic apparatus.

To reduce the above-described reduced performance capabilities of the fluid handling system, the one or more openings of the substrate facing surface 200 may be inspected for manufacturing defects prior to installation in the lithographic apparatus, as well as regularly inspected for blockages and other defects during use in the lithographic apparatus. It is therefore important to be able to regularly inspect the openings of the substrate facing surface 200.

There is a general need to improve the ability to inspect the openings of the substrate facing surface 200 of the fluid handling system. In particular, there is a general need to reduce the down-time of the lithographic apparatus caused by inspection of the fluid handling system and the openings in the substrate facing surface 200.

Embodiments include a tool and method of inspecting one or more openings in the substrate facing surface 200 of a fluid handling system. In particular, embodiments include a tool and method of inspecting one or more openings in the substrate facing surface 200 of a fluid handling system that increases inspection efficiency and reduces inspection time.

Figure 3A:
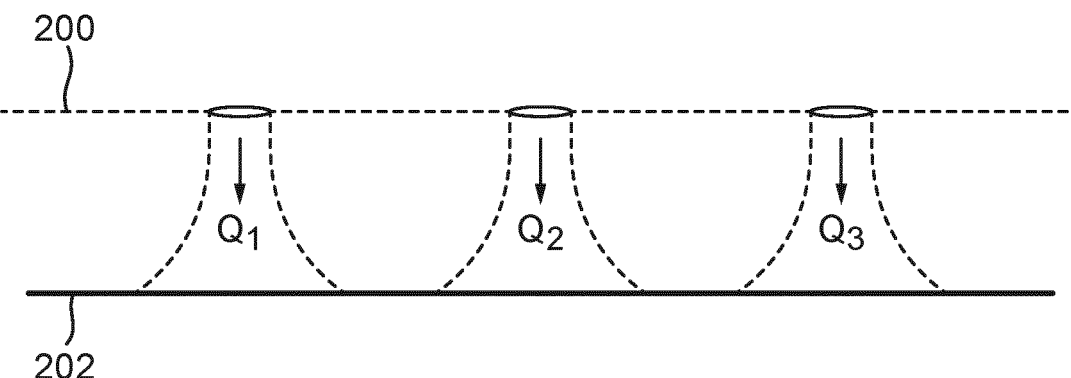
FIG. 3a depicts an embodiment of an inspection tool in plan view.

FIG. 3a shows an embodiment of an inspection tool in plan view. The inspection tool comprises an assessment substrate 202, a fluid supply (not shown), and an infrared sensor 203 (not shown).

In FIG. 3a, a substrate facing surface 200 is provided with three openings. Although FIG. 3a shows an exemplary embodiment with three openings, it is understood that more or less openings may be provided in the substrate facing surface 200. The substrate facing surface 200 may for example be provided with one or two openings. The substrate facing surface 200 may alternatively be provided with more than three openings, more than ten openings or more than one hundred openings. The openings may be any of the openings described in relation to FIGS. 2a to 2d. The openings may be of the same kind, or alternatively, the openings may be of different kinds. As an example, all three openings in FIG. 3a may be fluid supply members. As another example, all three openings in FIG. 3a may be fluid extraction members. As yet another example, the three openings may be one fluid supply member and two fluid extraction members, or any other combination of openings.

In embodiments, a fluid is supplied to one or more of the openings that are to be inspected. It is appreciated that it is not necessary for all openings provided in the substrate facing surface 200 to be inspected. Instead, the inspection tool according to embodiments may select a number of openings to be inspected, in which case fluid may be supplied only to those openings that are to be inspected.

The fluid is supplied to the one or more openings such that a jet of fluid exits each opening. The size, shape and flow rate of the fluid jet from each opening is accordingly dependent on the size and shape of the opening. The flow rate of the fluid jet from a first opening may be denoted $Q_1$, the flow rate of the fluid jet from a second opening may be denoted $Q_2$, the flow rate of the fluid jet from a third opening may be denoted $Q_3$. The flow rate through an opening may be lower for an opening suffering from a manufacturing defect, a blockage, contamination and/or other defect, than a similar opening without such defect. In the exemplary embodiment in FIG. 3a, $Q_3$ is greater than $Q_2$, which is greater than $Q_1$.

In a preferred embodiment, the fluid supplied to the one or more openings comprises a gas. Examples of gas that may supplied to the one or more openings may comprise air, CO2, hydrogen, and/or nitrogen.

The fluid supplied to the one or more openings may alternatively or additionally comprise a liquid. Suitable liquids may comprise water, such as Ultra-Pure Water (UPW).

It is understood that the type of supplied fluid in the inspection tool is not restricted by the type of opening. The type of supplied fluid in the inspection tool is accordingly not restricted by the type of fluid typically supplied or extracted by the opening in normal operation of the lithographic apparatus. It is appreciated that a fluid comprising a gas may be supplied to an opening that is a liquid supply or extraction member. Similarly, a fluid comprising a liquid may be supplied to a gas supply or extraction member. Desirably the fluid essentially consists of a single-phase. The essentially single-phase fluid may, however, comprise some dissolved gas.

The fluid is supplied by a fluid supply (not shown in FIG. 3a). The fluid supply may be a fluid supply present in the lithographic apparatus used in normal operation of the lithographic apparatus to supply fluid to fluid supply members. The fluid supply may alternatively be an independent fluid supply provided for the sole purpose of supplying fluid in the inspection tool. As an example, if the one or more openings being inspected are fluid supply members, a fluid supply integrated in the lithographic apparatus may be used. As another example, if the one or more openings being inspected are fluid extraction members, a separate fluid supply may be used.

The fluid jet exiting an opening, flows from the opening in a direction towards an assessment substrate 202 facing the substrate facing surface 200. The fluid jet flows toward the assessment substrate 202 and is incident on a surface of the assessment substrate 202 facing the substrate facing surface 200.

The assessment substrate 202 is a substrate used for assessment or inspection of the openings. The assessment substrate 202 may be similar to the substrate W. The assessment substrate 202 may, for example, have a similar shape to the substrate W. The assessment substrate 202 may be suitable for placing on the substrate support WT. The assessment substrate 202 may comprise silicon. The assessment substrate 202 may alternatively comprise another material that is substantially transparent to infrared radiation.

In the tool according to embodiments, the fluid is supplied at a temperature that differs from the temperature of the bulk of the assessment substrate 202. In other words, there is a temperature difference between the bulk of the assessment substrate 202 and the fluid jets. The fluid jets incident on the surface of the assessment substrate 202 will thus cause local temperature variations on the surface of the assessment substrate 202. The fluid jets will accordingly cool or heat the assessment substrate 202 at the locations where the fluid jets are incident on the assessment substrate 202.

In an embodiment, the fluid is supplied at a temperature higher than the bulk of the assessment substrate 202. The fluid jets will therefore locally heat the assessment substrate 202 at the locations where the fluid jets are incident on the assessment substrate 202. The temperature of the assessment substrate 202 at locations close to the fluid jets will accordingly be higher than the temperature of the bulk of the assessment substrate 202.

In another embodiment, the fluid is supplied at a temperature lower than the bulk of the assessment substrate 202. The fluid jets will therefore locally cool the assessment substrate 202 at the locations where the fluid jets are incident on the assessment substrate 202. The temperature of the assessment substrate 202 at locations close to the fluid jets will accordingly be lower than the temperature of the bulk of the assessment substrate 202.

In an embodiment, the fluid is supplied at a substantially ambient temperature. The ambient temperature may be an operating temperature of the lithographic apparatus. The assessment substrate 202 may then be either cooled or heated such that a temperature difference exists between the bulk of the assessment substrate 202 and the fluid jets. In an embodiment, the fluid is supplied at a temperature of between about 0 to 60 degrees Celsius, preferably at a temperature of between about 0 to 45 degrees Celsius, preferably at a temperature of between about 15 to 30 degrees Celsius, more preferably at a temperature of between about 20 to 25 degrees Celsius, and yet more preferably at a temperature of between about 20 to 23 degrees Celsius.

The temperature difference between the bulk of the assessment substrate 202 and the fluid jets may preferably be at least 5 degrees Celsius, more preferably be at least 10 degrees Celsius, even more preferably be at least 15 degrees Celsius, yet more preferably be at least 20 degrees Celsius, and yet again more preferably be at least 25 degrees Celsius. The local temperature variations in the assessment substrate 202 caused by the fluid jets may accordingly cover a range of at least 5 degrees Celsius, more preferably be at least 10 degrees Celsius, even more preferably be at least 15 degrees Celsius, yet more preferably be at least 20 degrees Celsius, and yet again more preferably be at least 25 degrees Celsius.

The local temperature variations on the surface of the assessment substrate 202 that are caused by the fluid jets and their temperature difference compared to the bulk of the assessment substrate 202, result in a temperature distribution in the assessment substrate 202.

Figure 3B:
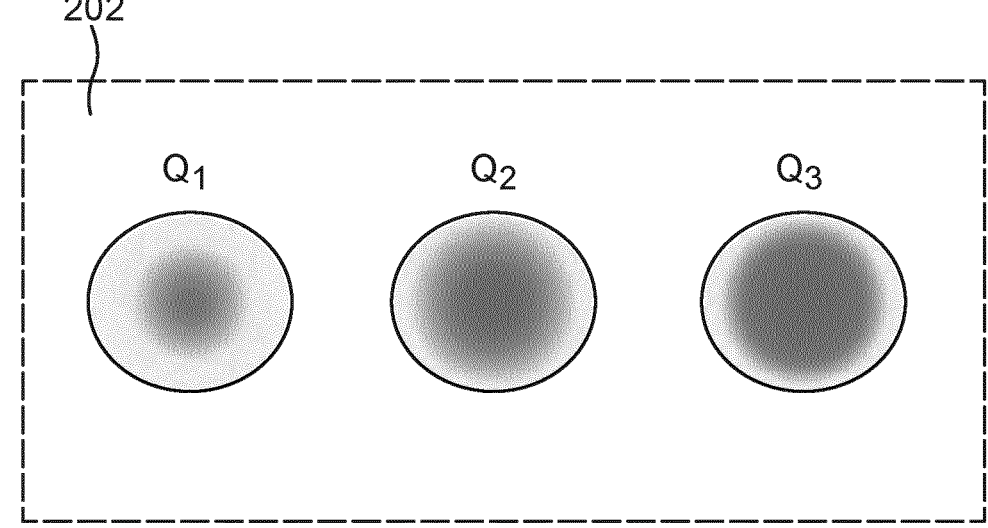
FIG. 3b depicts an embodiment of an assessment substrate in top view with an exemplary temperature distribution.

FIG. 3b shows the assessment substrate 202 from FIG. 3a in top view. FIG. 3b also shows the local temperature variations on the assessment substrate 202 caused by the fluid jets shown in FIG. 3a. It is appreciated that FIG. 3b only shows a relevant portion of assessment substrate 202, and that the shape and size of the assessment substrate 202 shown in FIG. 3b is non-limiting.

The local temperature variations, and their spatial distribution, on the assessment substrate 202 due to the fluid jets are dependent on the flow rate of the fluid jets. A higher flow rate will lead to a larger temperature variation and/or a larger spatial distribution of the temperature variation. This can be seen in FIG. 3b, where the temperature variations are greater for the fluid jet with a flow rate of $Q_3$, than for the fluid jet with a flow rate of $Q_2$, which in turn is greater than for the fluid jet with a flow rate of $Q_1$.

The flow rate from an opening may accordingly be assessed from the shape and intensity of the temperature profile on assessment substrate 202. Thus, information of flow rate of the one or more fluid jets may be obtained by considering the temperature distribution on the assessment substrate 202. Similarly, information about the shape and size of the fluid jets may be obtained by considering the temperature distribution on the assessment substrate 202. It is appreciated that a temperature distribution covering a larger range of temperatures generally makes it easier to obtain information about the fluid jets.

The information obtained about flow rate and/or fluid jet size and shape may then be used to assess the one or more openings in the substrate facing surface 200 of the fluid handling system. From considering the temperature distribution of the assessment substrate 202, a hole property of an opening may be detected. As an example, a manufacturing defect, blockage, contamination, or other defect of an opening may be detected. As another example, from considering the temperature distribution of the assessment substrate 202, an assessment of a hole shape and/or size may be performed.

The tool according to embodiments comprises an infrared sensor 203. The infrared sensor 203 is used to sense the temperature distribution of the assessment substrate 202. The infrared sensor 203 may comprise an infrared camera that is used to acquire one or more infrared images of the temperature distribution of the assessment substrate 202.

The infrared sensor 203 may alternatively be any other sensor capable of sensing the temperature distribution of the assessment substrate 202. A signal corresponding to the temperature distribution that has been sensed may be processed to obtain information about one or more hole properties of the one or more openings in the substrate facing surface 200.

The infrared sensor 203 may include an image processing system that includes an image acquirer, storage, and controller. The image acquirer may include one or more processors. For example, the image acquirer may include a computer, server, mainframe host, terminals, personal computer, any kind of mobile computing devices, and the like, or a combination thereof. The image acquirer may connect with the infrared camera through a medium such as an electrical conductor, optical fibre cable, portable storage media, IR, Bluetooth, internet, wireless network, wireless radio, or a combination thereof. The image acquirer may receive a signal from the infrared camera and may construct an image. The image acquirer may thus acquire images of a surface of the assessment substrate 202. The image acquirer may also perform various post-processing functions, such as generating contours, superimposing indicators on an acquired image, and the like. The image acquirer may perform adjustments of brightness and contrast, or the like of acquired images. The storage may be a storage medium such as a hard disk, cloud storage, random access memory (RAM), other types of computer readable memory, and the like. The storage may be coupled with image acquirer and may be used for saving scanned raw image data as original images, and post-processed images. The image acquirer and storage may be connected to controller. In some embodiments, image acquirer, storage, and controller may be integrated together as one control unit.

A non-transitory computer readable medium may be provided that stores instructions for a processor of a controller to carry out sensing by the infrared sensor 203, as well as receiving and processing data associated with signal information from the infrared sensor 203. Common forms of non-transitory media include, for example, a floppy disk, a flexible disk, hard disk, solid state drive (SSD), magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

In an embodiment, the infrared sensor 203 is located on a fluid handling system side of the assessment substrate 202. The infrared sensor 203 may thus sense the temperature distribution directly on the surface of the assessment substrate 202 facing the substrate facing surface 200. In an alternative preferred embodiment, the infrared sensor 203 is located on a side of the assessment substrate 202 opposite to the substrate facing surface 200. The infrared sensor 203 may thus sense the temperature distribution of the assessment substrate 202 through the assessment substrate 202 which is transparent to infrared radiation. Having the infrared sensor 203 located on a side of the assessment substrate 202 opposite to the substrate facing surface 200, ensures that the infrared sensor 203 does not interfere with the fluid flow paths from the openings to be inspected. Such an arrangement may also reduce space constraints on the infrared sensor 203.

The infrared sensor 203 may have a field of view that covers a portion of the assessment substrate 202 that corresponds to the entire relevant area of entire substrate facing surface 200. This allows for all openings of interest to be inspected at the same time. Accordingly, one operation of the inspection tool, and in particular, one sensing operation, may be sufficient to obtain information about all openings of interest.

The infrared sensor 203 may alternatively have a field of view that covers a smaller portion of the assessment substrate 202 that corresponds to only a portion of the relevant area of the substrate facing surface 200. The inspection tool may then be operated for a plurality of operations. The first operation may comprise supplying fluid from a first set of openings of interest and sensing a first temperature distribution, the second operation may comprise supplying fluid from a second set of openings of interest (at least partially different to the first set of openings) and sensing a second temperature distribution. The field of view of the infrared sensor 203 may then be moved relative to the assessment substrate 202 between operations. Multiple infrared sensors 203 can be provided.

The fluid handling system may be constructed of a conductive metal. In operation, the fluid handling system may be at a temperature higher than some parts of the inspection tool. As the fluid handling system may be constructed of conductive metal, it has a high thermal capacity, and may thus emit infrared radiation. This infrared radiation may obstruct the infrared sensor 203 from accurately sensing the temperature distribution of the assessment substrate 202.

The assessment substrate 202 according to embodiments may therefore be provided with a coating on a surface facing the fluid handling system. The coating may comprise an infrared shielding material. The infrared shielding material may preferably comprise cesium doped tungsten bronze. The coating may have a thickness that is sufficiently large to shield the assessment substrate 202 from infrared radiation emitting from the fluid handling system. The coating may thus reduce the influence of infrared radiation emitted from the fluid handling system on the sensed temperature distribution.

In an embodiment, the inspection tool may comprise a temperature control means for controlling a temperature of the assessment substrate 202. The temperature control means may be configured to continuously heat or cool the assessment substrate 202 such that it compensates for the local heating or cooling caused by the fluid jets. For example, if the fluid jets are at a temperature lower than the bulk of the assessment substrate 202, the fluid jets will locally and continuously cool the assessment substrate 202 at locations where the fluid jets are incident on the assessment substrate 202. Thus, after some time has passed, the assessment substrate 202 will have a lower bulk temperature than the initial bulk temperature, and eventually, the assessment substrate 202 will be at a uniform low temperature. The temperature control means may thus continuously heat the assessment substrate 202, such that the heating by the temperature control means equals the cooling by the fluid jets. A (temporal) steady state thermal equilibrium may thus be obtained where the bulk temperature of the assessment substrate 202 is constant with time, and the temperature distribution of the assessment substrate 202 is constant with time. It is appreciated that local (spatial) temperature variations will still be present in the assessment substrate 202 due to the fluid jets incident on the assessment substrate 202 surface. The above reasoning also applies to a converse example where the fluid jets are at a temperature higher than the bulk of the assessment substrate 202. In such a case, the temperature control means would be configured to continuously cool the assessment substrate 202 to reach a steady state thermal equilibrium.

The temperature control means may be any suitable means for controlling a temperature of the assessment substrate 202. The temperature control means may comprise a heating means and/or a cooling means. The heating means and cooling means may be any suitable means that is capable of heating and cooling the assessment substrate respectively. The heating means may be heating wires, for example heating wires embedded in the assessment substrate 202. The heating means may, alternatively or additionally, be heating means using infrared irradiation. The temperature control means may further comprise at least one temperature sensor for measuring the temperature of the assessment substrate 202 in one or more locations. The temperature control means may also comprise a controller for controlling the heating and/or cooling means in dependence on the temperature measured by the temperature sensor.

In an embodiment comprising the above-described temperature control means, the temperature distribution of the assessment substrate 202 may be sensed by the infrared sensor 203 in a steady state thermal equilibrium. Once the inspection tool is turned on (i.e. from a time where the fluid jets are started), a sufficient amount of time may pass before the temperature distribution is sensed so as to allow the system to reach a steady state thermal equilibrium. This allows any transients to disappear. Once a steady state thermal equilibrium has been reached, the infrared sensor 203 may sense the temperature distribution at any time because the temperature distribution is no longer changing with time. It is therefore possible to perform the sensing operation a plurality of times without the temperature distributions being affected by the time that has passed between the sensing operations. Additionally, since no transients are present, the temperature distribution may be sensed with higher accuracy, than if any transients are presents.

In an embodiment, fluid jets may be supplied from all openings of interest at once. Once steady state thermal equilibrium has been reached for the entire assessment substrate 202, the infrared sensor 203 may perform a plurality of sensing operations sequentially. The first operation may comprise sensing a first temperature distribution due to a first set of openings, the second operation may comprise sensing a second temperature distribution due to a second set of openings (at least partially different to the first set of openings) and so on. Accordingly, it is not necessary to wait between sensing operations for transients to disappear, because the assessment substrate 202 is at a steady state thermal equilibrium. Thus, a much quicker sequence of sensing operations may be carried out. It is therefore possible to quickly inspect a large number of openings covering an area significantly larger than the field of view of the sensor.

FIG. 4 shows a schematic of the different heat transfer mechanisms affecting the temperature distribution of the assessment substrate 202.

In steady state thermal equilibrium, there is a heat transfer to the assessment substrate 202 due to the fluid jet incident on the surface of the assessment substrate 202. Heat transfer due to radiation from the assessment substrate 202 is also present due to a temperature difference between at least part of the assessment substrate 202 and the ambient air. Similarly, heat transfer due to convection is present. Heat transfer through the assessment substrate 202 is also present in the form of conduction.

For a thin assessment substrate 202, the heat transfer due to conduction may be neglected for a first order approximation of the system. In the following equations it is also assumed that the heat transfer due to the fluid jet is only present in the stagnation region of the fluid jet, and that this heat transfer takes place at constant rate.

The rate of heat transfer from the fluid jet incident on the surface of the assessment substrate 202, $Q_{FLUID}$, may be described, using a jet velocity profile for a flat jet, by:

$$Nu_{FLUID}=0.675Re^{0.5} \tag{1}$$

where Nu is the Nusselt number of the fluid, and Re is the Reynolds number of the fluid jet.

The rate of heat transfer from the fluid jet incident on the surface of the assessment substrate 202, $Q_{FLUID}$, may be described, using a jet velocity profile for a parabolic jet, by:

$$Nu_{FLUID}=0.868Re^{0.5} \tag{2}$$

The fluid jets in the inspection tool of an embodiment, typically have a velocity profile between the flat jet profile and the parabolic jet profile. Equations 1 and 2, therefore represent two extremes of estimated rate of heat transfer, with the actual rate of heat transfer being somewhere in between the two. Accordingly, an estimated range of the actual rate of heat transfer may be obtained.

The rate of heat transfer through radiation, $Q_{RAD}$, may be described by:

$$\frac{dQ_{RAD}}{dt} = \sigma \epsilon A_S \left( T_S^4 - T_{amb}^4 \right) \tag{3}$$

where $\sigma$ is the Stefan-Boltzmann constant, e is the emissivity of the assessment substrate material, $A_S$ is the area of the spot of the fluid jet, $T_S$ is the temperature of the spot of the fluid jet incident on the surface of the assessment substrate 2020, and $T_{amb}$ is the ambient temperature in the space between the substrate facing surface 200 and the assessment substrate 202.

The rate of heat transfer through convection, $Q_{CONV}$, may be described by:

$$Nu_{CONV}=0.27Ra^{0.25} \tag{4}$$

where $Nuc_{CONV}$ the Nusselt number for convective cooling or heating, and Ra is the Rayleigh number of the spot of the fluid jet incident on the assessment substrate 202.

At thermal equilibrium, the heat transfer mechanisms shown in FIG. 4 must balance. Equations 1 to 4 may then be combined to obtain the following relation:

$$h_{FLUID}(T_{FLUID} - T_S)^4 = 2\epsilon\sigma \left(T_S^4 - T_{amb}^4 \right)^4 + E(T_S - T_{amb})^5 \tag{5}$$

where $h_{FLUID}$ is the heat transfer coefficient of the fluid, $T_{FLUID}$ is the temperature of the fluid, and E is given by:

$$E = \frac{0.27 \left(PrR_S^7 g\beta \right)^{0.25}}{\kappa \nu^{0.5}} \tag{6}$$

where Pr is the Prandtl number, $R_S$ is the radius of the spot of the fluid jet on the surface of the assessment substrate 202, g is the gravitational constant, β is the coefficient of volumetric expansion, κ is the thermal conductivity of air, and v is the dynamic viscosity of air.

From the relation in equation (5), an estimate may be obtained of the sensitivity of the local temperature variations in the assessment substrate 202 to a change in fluid jet flow. As an example, a reference scenario is compared to a deviated scenario. Both scenarios have a fluid supply temperature of 45 degrees Celsius and a bulk assessment substrate temperature of about 21 degrees. The only difference between the reference and the deviated scenario is that the deviated scenario has a 3.3% deviation from the flow rate of the fluid jet compared to the reference scenario. The deviation between the temperature distributions in the assessment substrate 202 of the reference scenario and of the deviated scenario may then be compared (based on equation 5). In the deviated scenario, the local temperature in the assessment substrate 202, at the centre of the fluid jet, may change by about 100 mK compared to the reference. Such a change in temperature between the two scenarios is readily detectable by known infrared sensors. Known infrared sensors may detect temperature changes significantly smaller than this, for example changes of about 25 mK. The 3.3% deviation in flow rate may be considered representative of a minimum expected deviation due to blockages and/or contamination.

It may thus be seen that the inspection tool according to embodiments can readily assess deviations in the fluid jets originating from defects of an opening.

Four specific exemplary configurations of a tool according to embodiments will hereafter be discussed in relation to FIGS. 5 to 8.

FIG. 5 shows an embodiment of inspection tool 201. The inspection tool 201 is positioned below the substrate facing surface 200. The infrared sensor 203 is positioned on a side of the assessment substrate 202 opposite to the fluid handling system. The assessment substrate 202 only covers a portion of the relevant area of interest of the substrate facing surface 200. The inspection tool 201 is therefore smaller such that it may be in locations with limited space. In order to inspect all openings in the relevant area of interest of the substrate facing surface 200, it is thus necessary to move the inspection tool 201 in an x-y plane (i.e. horizontally). The inspection tool 201 may therefore comprise translation means for moving the inspection tool 201 in the x-y plane. The translation means may be any means capable of moving the inspection tool 201 in the x-y plane.

In use of the inspection tool 201, fluid will be supplied to the set of openings located above the assessment substrate 202. The infrared sensor 203 will then sense the temperature distribution of the assessment substrate 202 due to the fluid jets from those openings. The inspection tool 201 will then be moved to a different location of the substrate facing surface 200, after which the above steps will be repeated for those openings.

FIG. 6 shows another embodiment of inspection tool 201. The inspection tool 201 is positioned below the substrate facing surface 200. The infrared sensor 203 is positioned on a side of the assessment substrate 202 opposite to the fluid handling system. The assessment substrate 202 is sufficiently large to cover the entire relevant area of the substrate facing surface 200, and the infrared sensor 203 has a field of view covering the entire assessment substrate 202.

In use, fluid may be supplied to all openings of interest simultaneously, and one sensing operation is sufficient to inspect all openings.

Figure 7:
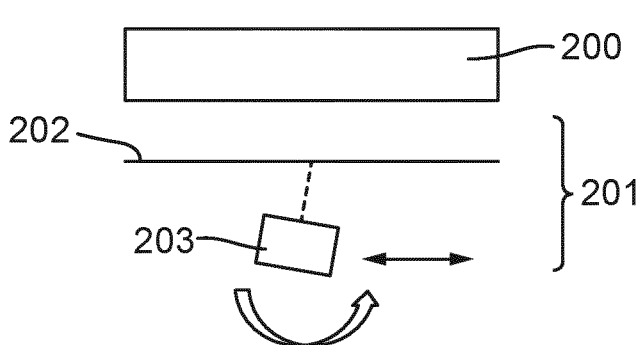
FIG. 7 shows an inspection tool according to an embodiment.

FIG. 7 shows another embodiment of inspection tool 201. The inspection tool 201 is positioned below the substrate facing surface 200. The infrared sensor 203 is positioned on a side of the assessment substrate 202 opposite to the fluid handling system. The assessment substrate 202 is sufficiently large to cover the entire relevant area of the substrate facing surface 200, however the infrared sensor 203 has a field of view covering only a portion of the assessment substrate 202. The inspection tool 201 may therefore comprise rotation and/or translation means for respectively rotating and/or moving the infrared sensor 203.

In use, fluid may be supplied to all openings of interest simultaneously. However, a plurality of sensing operations have to be performed to inspect all openings of interest. The infrared sensor 203 may sense the temperature distribution of a first portion of the assessment substrate 202 due to fluid jets from a first set of openings. The infrared sensor 203 may then be moved and/or rotated such that its field of view covers a (at least partially) different area of the assessment substrate 202. The infrared sensor 203 may then sense the temperature distribution of a second portion of the assessment substrate 202 due to fluid jets from a second set of openings. The above steps may then be repeated until all openings of interest have been inspected.

Figure 8:
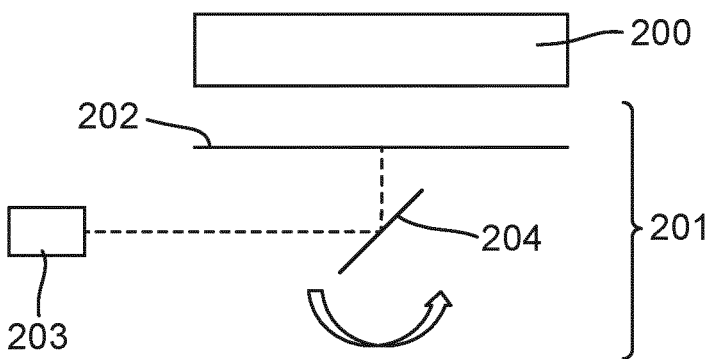
FIG. 8 shows an inspection tool according to an embodiment.

FIG. 8 shows another embodiment of inspection tool 201. The inspection tool 201 is positioned below the substrate facing surface 200. The infrared sensor 203 is positioned in a location remote from the assessment substrate 202. The inspection tool 201 may therefore comprise one or more optical elements (e.g. mirrors) in an optical path between the infrared sensor 203 and a surface of the assessment substrate 202. The assessment substrate 202 is sufficiently large to cover the entire relevant area of the substrate facing surface 200, however the infrared sensor 203 has, through the one or more optical elements, a field of view covering only a portion of the assessment substrate 202. The inspection tool 201 may therefore comprise rotation and/or translation means for respectively rotating and/or moving the one or more optical elements.

In use, fluid may be supplied to all openings of interest simultaneously. However, a plurality of sensing operations have to be performed to inspect all openings of interest. The infrared sensor 203 may sense the temperature distribution of a first portion of the assessment substrate 202 due to fluid jets from a first set of openings. The one or more optical elements may then be moved and/or rotated such that the field of view of the infrared sensor 203 covers a (at least partially) different area of the assessment substrate 202. The infrared sensor 203 may then sense the temperature distribution of a second portion of the assessment substrate 202 due to fluid jets from a second set of openings. The above steps may then be repeated until all openings of interest have been inspected.

Figure 9:
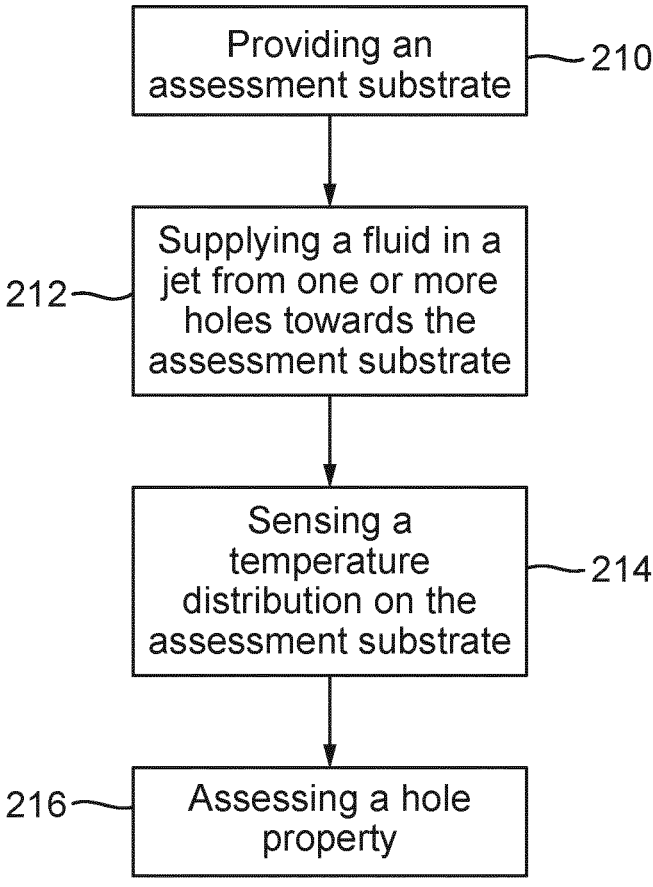
FIG. 9 depicts a method of inspecting one or more openings according to embodiments.

FIG. 9 shows a method of inspecting one or more openings according to embodiments.

In step 210, an assessment substrate is provided.

In step 212, a fluid is supplied in a fluid jet from each of one or more openings of a substrate facing surface 200 of a fluid handling system towards the assessment substrate 202. The fluid is supplied at a fluid temperature such that the one or more fluid jets cause local temperature variations in at least part of the assessment substrate 202.

In step 214, an infrared sensor 203 senses a temperature distribution of the assessment substrate 202 in dependence on the local temperature variations.

In step 216, a hole property is assessed in dependence on the sensed temperature distribution.

The method according to embodiments may comprises an additional step of image post-processing. The image post-processing may comprise processing the sensed temperature distribution. The image post-processing may comprise comparing the sensed temperature distribution to a reference temperature distribution. The reference temperature distribution may for example be a known temperature distribution resulting from a fluid jet which known characteristics.

The method of FIG. 9 may be used to inspect openings of a substrate facing surface 200 in a lithographic apparatus. The method may be performed while the substrate facing surface 200 is located in the lithographic apparatus. The method may be performed while the substrate facing surface 200 is located in a similar position as in normal operation of the lithographic apparatus.

The method of FIG. 9 may be used to inspect openings of a substrate facing surface 200 of a lithographic apparatus when the substrate facing surface 200 is located outside of the lithographic apparatus. The method may be performed in an inspection lithographic apparatus that is different than the lithographic apparatus that the substrate facing surface 200 is normally located in during normal operation. The method may be performed in a dedicated testing apparatus that does not have other components of a lithographic apparatus.

Embodiments may be incorporated into any of a number of known types of fluid handling systems, such as those shown in FIGS. 2a to 2d. Embodiments of the invention is not limited to specific arrangements of features of a fluid handling system or of the substrate facing surface thereof. Embodiments may be used to inspect any opening in any known type of fluid handling system.

Although specific reference may have been made above to the use of embodiments of the invention in the context of inspecting openings in a substrate facing surface of a fluid handling system, it will be appreciated that the invention is not limited to only inspecting openings in said surface of a fluid handling system. Embodiments of the invention may be used to inspect openings in any other component of a lithographic apparatus. Embodiments may also be used to inspect openings in components other than of a lithographic apparatus, such as components of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use ambient (non-vacuum) conditions.

It is appreciated that the inspection tool 201 according to embodiments, and the method of inspecting one or more openings according to embodiments, may be used to inspect any fluid supply or fluid extraction opening of a lithographic apparatus. Embodiments include a method of, and inspection tool for, inspection of any gas purging opening, gas bearing, or temperature conditioning opening of a lithographic apparatus.

Although specific reference has been made in this text to the use of an immersion lithographic apparatus, it should be understood that embodiments of the invention is not limited to this type of lithographic apparatus. Embodiments, for example, include inspection of openings in an extreme ultra-violet (EUV) lithographic apparatus. Embodiments used in an EUV lithographic apparatus are not limited to inspection of openings of a fluid handling structure. Embodiments may, for example, include inspection of air showers in a mask purge hood, gas bearings, and/or gas debris barriers of an EUV lithographic apparatus.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Where the context allows, embodiments of the invention may be implemented in hardware, firmware, software, or any combination thereof. Embodiments of the invention may also be implemented by instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use ambient (non-vacuum) conditions.

Although specific reference may have been made above to the use of embodiments of the invention in the context of optical lithography, it will be appreciated that the invention, where the context allows, is not limited to optical lithography.

The invention claimed is:

1. A tool comprising:
   a fluid supply configured to supply a jet of fluid from each of one or more holes in a component of a lithographic apparatus to a surface of an assessment substrate, wherein the fluid is supplied at a fluid temperature such that the one or more jets of fluid cause local temperature variations in at least part of the assessment substrate; and
   an infrared sensor configured to sense a temperature distribution of the assessment substrate in dependence on the local temperature variations, the temperature distribution providing an indication of a physical property of the one or more holes.

2. The tool according to claim 1, wherein the component is an immersion hood, and/or wherein the fluid comprises a gas, and/or wherein the tool is configured to perform a plurality of infrared sensing operations, and/or wherein the infrared sensor comprises an infrared camera.

3. The tool according to claim 1, wherein the temperature distribution covers a range of at least 20 degrees Celsius, and/or wherein the fluid temperature is between 20 and 23 degrees Celsius.

4. The tool according to claim 1, wherein the local temperature variations are due to local cooling of at least part of the assessment substrate by the one or more jets of fluid.

5. The tool according to claim 1, further comprising a temperature control device configured to continually control the temperature of the assessment substrate to compensate for the local temperature variations caused by the one or more jets of fluid, such that a steady state equilibrium is obtained, and/or further comprising one or more mirrors in an optical path between the sensor and the assessment substrate, and/or further comprising one or more translation and/or rotation devices configured to move and/or rotate the sensor.

6. The tool according to claim 5, further comprises one or more translation devices configured to move the assessment substrate.

7. The tool according to claim 1, wherein the assessment substrate is transparent to infrared radiation, and/or wherein the assessment substrate comprises a coating of infrared shielding material on the surface.

8. The tool according to claim 7, wherein the infrared sensor is located on a side of the assessment substrate opposite to the surface.

9. The tool according to claim 1, wherein the physical property is a hole blockage, and/or is a hole contamination, and/or is a cross-sectional uniformity of a hole.

10. The tool according to claim 1, wherein the one or more holes are configured to supply a fluid therethrough or extract fluid therethrough.

11. A lithographic apparatus comprising:
the tool according to claim 1; and
the component comprising one or more holes.

12. The lithographic apparatus according to claim 11, wherein the component is located on a side of the assessment substrate closest to the surface.

13. A method comprising:
supplying a jet of fluid from each of one or more holes in a component of a lithographic apparatus to a surface of an assessment substrate, wherein the fluid is supplied at a fluid temperature such that the one or more jets of fluid cause local temperature variations in at least part of the assessment substrate;
sensing, by an infrared sensor, a temperature distribution of the assessment substrate in dependence on the local temperature variations; and
assessing a physical property of the one or more holes in dependence on the sensed temperature distribution.

14. The method according to claim 13, wherein the providing the assessment substrate, supplying the fluid, and sensing the temperature distribution, are performed while the component is located in the lithographic apparatus.

15. The method of claim 13, wherein the component is an immersion hood.

16. The method of claim 13, wherein the fluid comprises a gas.

17. The method of claim 13, wherein the temperature distribution covers a range of at least 20 degrees Celsius.

18. The method of claim 13, wherein the local temperature variations are due to local cooling of at least part of the assessment substrate by the one or more jets of fluid.

19. The method of claim 13, wherein the fluid temperature is between 20 and 23 degrees Celsius.

20. The tool according to claim 1, wherein the local temperature variations are due to local heating of at least part of the assessment substrate by the one or more jets of fluid.

* * * * *